US007417483B2

(12) United States Patent
Wong et al.

(10) Patent No.: US 7,417,483 B2
(45) Date of Patent: Aug. 26, 2008

(54) WIDE-BAND WIDE-SWING CMOS GAIN ENHANCEMENT TECHNIQUE AND METHOD THEREFOR

(75) Inventors: Chi Chun Wong, Hong Kong (CN); Terasuth Ko, Hong Kong (CN)

(73) Assignee: Supertex, Inc., Sunnyvale, CA (US)

( * ) Notice: Subject to any disclaimer, the term of this patent is extended or adjusted under 35 U.S.C. 154(b) by 149 days.

(21) Appl. No.: 11/423,764

(22) Filed: Jun. 13, 2006

(65) Prior Publication Data

US 2006/0290418 A1 Dec. 28, 2006

Related U.S. Application Data

(60) Provisional application No. 60/693,165, filed on Jun. 23, 2005.

(51) Int. Cl.
*H03L 5/00* (2006.01)

(52) U.S. Cl. .......................... 327/333; 326/63; 326/68; 326/80; 326/81; 327/543

(58) Field of Classification Search ................. 327/205, 327/333, 543; 326/63, 68, 80–83
See application file for complete search history.

(56) References Cited

FOREIGN PATENT DOCUMENTS

KR 2002012862 A * 2/2002

* cited by examiner

*Primary Examiner*—Kenneth B. Wells
*Assistant Examiner*—Brandon S Cole
(74) *Attorney, Agent, or Firm*—Jeffrey D. Moy; Weiss & Moy, P.C.

(57) ABSTRACT

A regulated cascode current source has a current source circuit. A level shifter circuit is coupled to the current source circuit. The level shifter circuit has a circuit for independently controlling a voltage on a cascode node.

8 Claims, 5 Drawing Sheets

Cascoded gain stage with new gain enhancement structure. (Our invention)

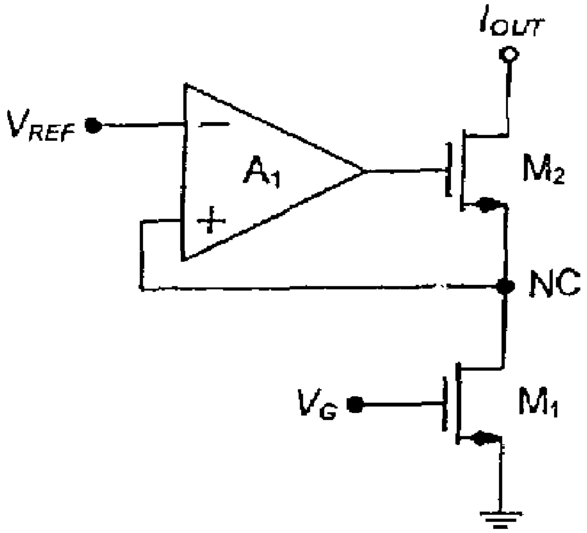
FIGURE 1: Regulated cascode current source.
(Prior Art)

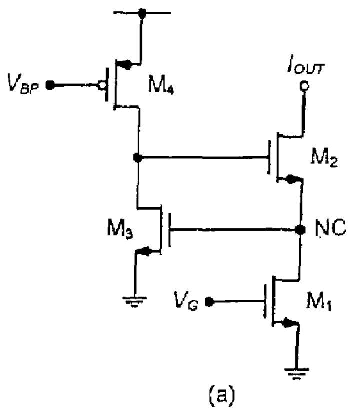
(a)
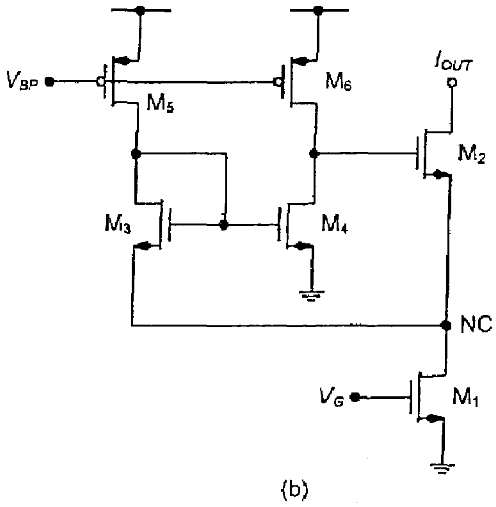
(b)
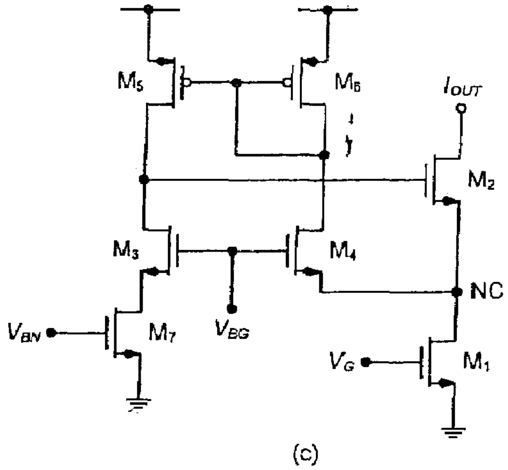
(c)
FIGURE 2: Regulated cascode current source: three implementations. (a) and (b): prior art, (c): US patent 5 337 021
(Prior Art)

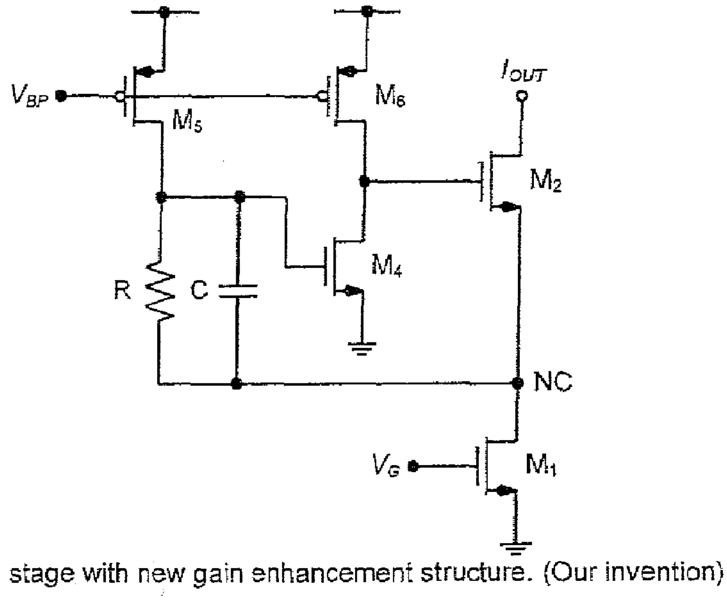
FIGURE 3: Cascoded gain stage with new gain enhancement structure. (Our invention)
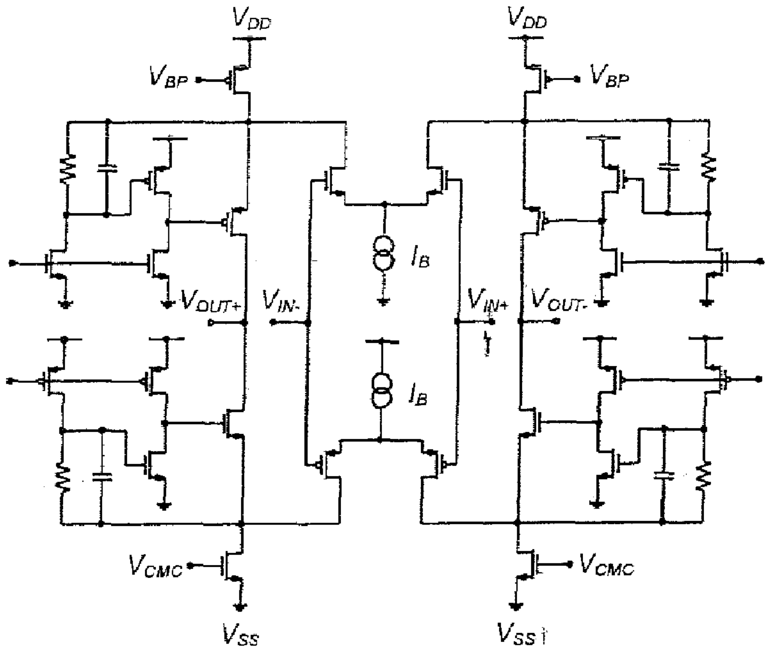
FIGURE 4: Complete circuit diagram of the op amp (Realization example)

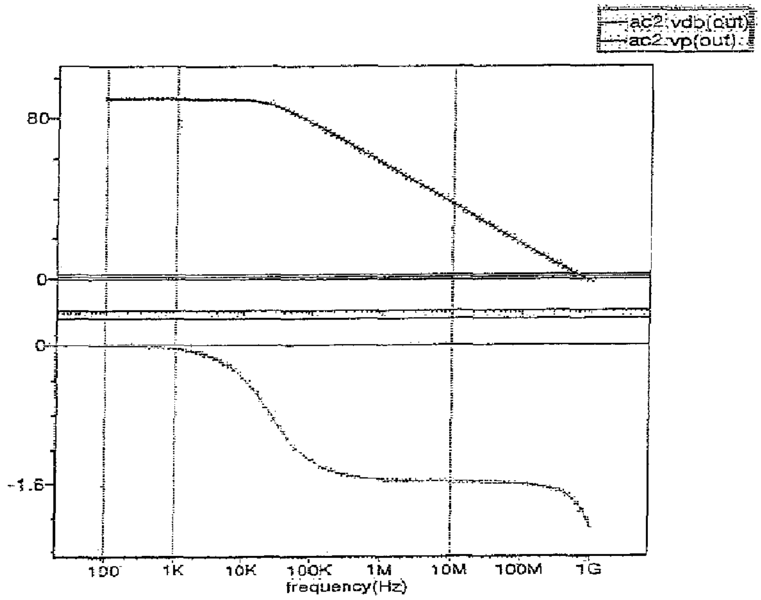
FIGURE 5: Results of gain and phase measurements with gain enhancement
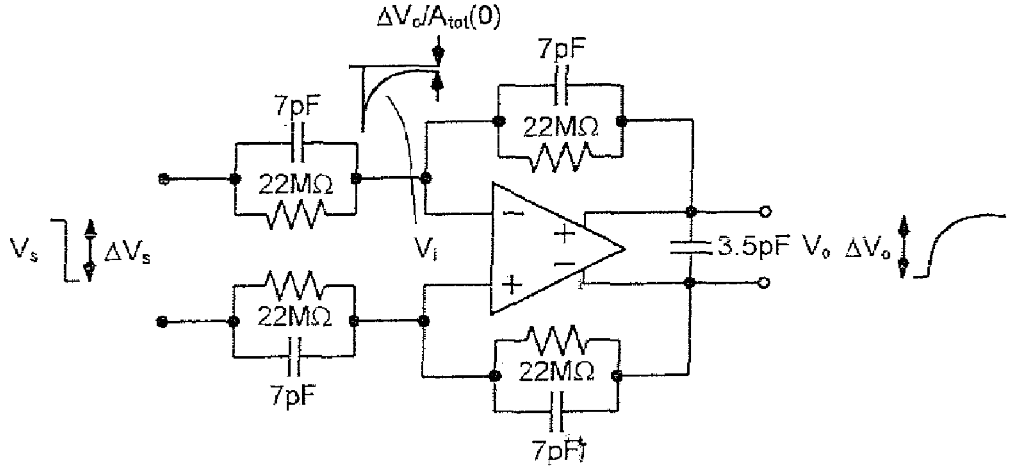
FIGURE 6: Scheme for simulating settling behavior

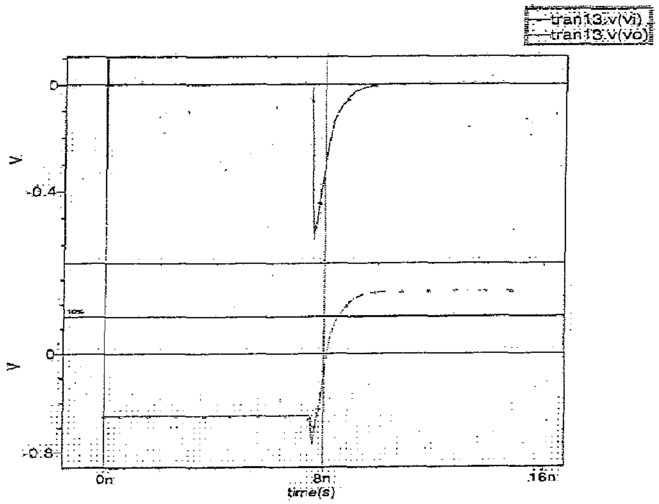
(a) $\Delta V_s$ = 1V
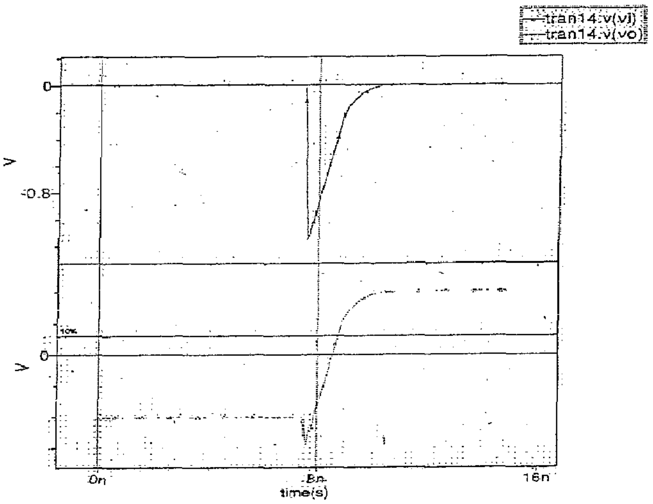
(b) $\Delta V_s$ = 2V
FIGURE 7: Settling simulation results. The error signal at the op-amp input (upper trace) and the output signal (lower trace) with: (a) $\Delta V_o$ = 1V, (b) $\Delta V_o$ = 2V.
TABLE I
MAIN CHARACTERISTICS OF THE OP AMP
| | |
|---|---|
| DC-gain | 90dB |
| Unity-gain freq. | 850MHz |
| Load cap. | 3.5pF |
| Phase margin | 65deg |
| Power cons. | 100mW |
| Output-swing | 2V |
| Supply voltage | 2.5V |
FIGURE 8

WIDE-BAND WIDE-SWING CMOS GAIN ENHANCEMENT TECHNIQUE AND METHOD THEREFOR

RELATED APPLICATION

This application is related to U.S. Provisional Application Ser. No. 60/693,165, filed Jun. 23, 2005, in the name of the same inventors listed above, and entitled, "WIDE-BAND WIDE-SWING CMOS GAIN ENHANCEMENT TECHNIQUE". The present patent application claims the benefit under 35 U.S.C. §119(e).

FIELD OF THE INVENTION

The present invention relates generally to regulation amplifier, and more specifically to a wide-band wide-swing CMOS gain enhancement technique.

BACKGROUND OF THE INVENTION

In many applications, the op-amp DC gain requirement is higher than what is achievable with simple single stage single stage topologies. Techniques to enhance the op-amp DC gain without going into multiple stage architecture are especially welcome in high speed circuits, where the high current levels make the transistor large.

A very widely-used method is shown in FIG. 1. In FIG. 1, the gate of the cascode transistor M2 is connected to the output of the feedback stage Al. This has two effects: 1) the resistance at the node NC is lowered by the loop gain Al and bandwidth increased, and 2) the total output conductance of the current source is lowered by the same amount. A calculation using equivalent MOSFET circuits yields a total output conductance:

$$g_{out}=(g_{ds1}g_{ds2})/A_1\, g_{m2}$$

Thus, the regulation lowered the output conductance by the gain of the regulation amplifier Al and, when the current source is utilized in an operational transconductance amplifier (OTA) the DC gain is increased by the same amount.

Referring now to FIGS. 2A-2C, three different implementations of the regulation amplifier are shown. While all three regulation amplifiers work, they each have certain drawbacks. In FIG. 2A the regulation amplifier is a simple design but sets the voltage on the cascode node NC unnecessarily high. The circuit in FIG. 2B utilizes a level shifter. To set the voltage on the cascode node NC above $V_{dsat1}$, $V_{dsat4}$ needs to be higher than $V_{dsat1}+V_{dsat3}$. The large value of $V_{dsat4}$ degrades $g_{m4}$, so as to the loop gain and bandwidth. The other implementation in FIG. 2C is a common gate amplifier. The low input impedance largely reduces the loop gain and output impedance, and makes it inferior to the circuit in FIG. 2A, although it allows the biasing of the cascade node NC to a lower voltage.

Therefore, it would be desirable to provide a regulation amplifier that overcomes the above problems. The regulation amplifier would use a wide-band wide-swing CMOS gain enhancement technique.

SUMMARY OF THE INVENTION

In accordance with one embodiment of the present invention, a regulated cascode current source is disclosed. The regulated cascode current source has a current source circuit. A level shifter circuit is coupled to the current source circuit.

The level shifter circuit has a circuit for independently controlling a voltage on a cascode node.

In accordance with another embodiment of the present invention, a regulated cascode current source is disclosed. The regulated cascode current source has a current source circuit. The current source circuit has a first transistor having a first, second and third terminal. A second terminal of the first transistor is coupled to the level shifter circuit. A third terminal is coupled to the cascode node. The current source circuit has a second transistor having a first, second and third terminal. A first terminal of the second transistor is coupled to the cascode node. A second terminal of the second transistor is coupled to a voltage source. A third terminal of the second transistor is coupled to ground. A level shifter circuit is coupled to the current source circuit. The level shifter circuit has a circuit for independently controlling a voltage on a cascode node. The level shifter circuit has a third transistor having a first, second and third terminal. The first terminal of the third transistor is coupled to a voltage supply. A third terminal of the third transistor is coupled to the current source circuit. The level shifter circuit has a fourth transistor having a first, second and third terminal. The first terminal of the fourth transistor is coupled to the voltage supply. The second terminal of the fourth transistor is coupled to the second terminal of the third transistor. The third terminal of the third transistor is coupled to the circuit for independently controlling a voltage on a cascode node. The level shifter circuit has a fifth transistor having a first, second and third terminal. The first terminal of the fifth transistor is coupled to the third terminal of the third transistor. The second terminal of the fifth transistor is coupled to the circuit for independently controlling the voltage on a cascode node. The third terminal of the fifth transistor coupled to ground. The circuit for independently controlling the voltage on a cascode node is coupled to the third terminal of the fourth transistor and to the cscode node.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, as well as a preferred mode of use, and advantages thereof, will best be understood by reference to the following detailed description of illustrated embodiments when read in conjunction with the accompanying drawings, wherein like reference numerals and symbols represent like elements.

FIG. 1 is a prior art regulated cascade current source.

FIG. 2A is a prior art regulated cascade current source.

FIG. 2B is a prior art regulated cascade current source.

FIG. 2C is a prior art regulated cascade current source.

FIG. 3 is a regulated cascade current source having a cascaded gain stage with a gain enhancement structure of the present invention.

FIG. 4 is a circuit diagram of the op-amp with the gain stages comprising the present invention.

FIG. 5 is a diagram showing the results of the gain and phase measurements using the present invention.

FIG. 6 is a scheme for simulating settling behavior.

FIG. 7A-7B is a graph showing settling simulation results. The error signal at the op-amp input (upper trace) and the output signal (lower trace) with (a) $\Delta V_0=1V$, and (b) $\Delta V_0=2V$.

FIG. 8 is a table showing the main characteristics of the op-amp.

DESCRIPTION OF PREFFERED EMBODIMENT

The gain-boost technique with the regulation amplifier GBW as large as the circuit in FIG. 2A and low voltage on the cascode node NC is invented here based on reducing the voltage level shift in FIG. 2B by replacing the MOS level shifter M3 with a parallel combination of resistor R and capacitor C as shown in FIG. 3. The resistor R sets the voltage on the cascade node NC independently without requiring large $V_{dsat4}$. Thus, the GBW of the regulation amplifier remains identical to the circuit in FIG. 2(*a*), provided that 1/RC is much smaller than the GBW.

In this section, the implementation of the main op amp and the addition gain stages are discussed. The main stage is a folded-cascode amplifier. This fully differential implementation with the improved cascoded gain stage allows for an output voltage swing as large as 2V at a 2.5V supply. The op-amp (FIG. 4) has been integrated in a 0.25-μm CMOS process. The two NMOS transistors 10 and 12 are connected to VCMC control the common-mode bias voltage at the output.

Result of gain simulation with gain enhancement is shown in FIG. 5. A dc-gain of 90 dB combined with a unity-gain frequency of 850 MHz is achieved. The settling behavior is simulated according to FIG. 6 by applying a step, $\Delta V_s$, at the input. The resistors R1 are needed for dc biasing of the op-amp and have no influence on the settling behavior.

The error signal $V_i$ at the op-amp input, and the output signal $\Delta V_o$ are shown in FIG. 7. In FIG. 7(*a*), $\Delta V_o$=1V, which is small enough to avoid slewing. The error signal is smaller than 0.1 mV, which corresponds to a dc gain higher than 80 dB. In FIG. 6 the feedback factor B is ½, whereas the unity-gain frequency is 850 MHz. The theoretical settling time constant τ is 370 ps. Settling to 0.1% takes 7τ=2.6 ns and corresponds to a 1-mV.error at the output. With a feedback factor B=½, this corresponds to an error signal of Vi=0.5V. From FIG. 7(*a*), the simulated setting time for 0.1% accuracy is 3.4 ns. In FIG. 7(*b*), $\Delta V_o$=2V, showing a normal slewing behavior and a large output swing. The main simulated characteristics of the op-amp are summarized in Table I of FIG. 8.

A very wide output swing and high DC gain are achieved in combination with large unity-gain frequency. With this technique, an op-amp was realized in a standard 0.25 μm CMOS process that had a DC gain of 90 dB together with a unity-gain frequency of 850 MHz. The op-amp shows one-poll roll-off and a single-pole settling behavior. The technique does not cause any loss in output voltage swing. At a supply voltage of 2.5V, an output swing of about 2.0V is achieved without loss in DC gain.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A circuit apparatus comprising:

a current source circuit; and a level shifter circuit coupled to the current source circuit wherein the level shifter circuit has a circuit for independently controlling a voltage on a cascode node;

wherein the current source comprises:

a first transistor having a first, second and third terminal, a second terminal of the first transistor coupled to the level shifter current, and a third terminal coupled to the cascode node; and a second transistor having a first, second and third terminal, a first terminal of the second transistor coupled to the cascode node, a second terminal of the second transistor coupled to a voltage source, and a third terminal of the second transistor coupled to ground;

wherein the level shifter circuit comprises:

a third transistor having a first, second and third terminal, the first terminal of the third transistor coupled to a voltage supply, and the third terminal of the third transistor coupled to the current source circuit;

a fourth transistor having a first, second and third terminal, the first terminal of the fourth transistor coupled to the voltage supply, the second terminal of the fourth transistor coupled to the second terminal of the third transistor, and the third terminal of the fourth transistor coupled to a circuit for independently controlling a voltage on a cascode node;

a fifth transistor having a first, second and third terminal, the first terminal of the fifth transistor coupled to the third terminal of the third transistor, the second terminal of the fifth transistor coupled to the circuit for independently controlling the voltage on a cascode node, and the third terminal of the fifth transistor coupled to ground; and the circuit for independently controlling the voltage on a cascode node coupled to the third terminal of the fourth transistor and to the cascode node, the circuit for independently controlling the voltage on a cascode node comprising:

a resistive element for independently controlling the voltage on a cascode node; and a capacitive element coupled in parallel to the resistive element, the resistive element and the capacitive element coupled to the second terminal of the fifth transistor and the cascode node.

2. A circuit apparatus in accordance with claim 1 wherein the first transistor and the second transistor are NMOS transistors.

3. A circuit apparatus in accordance with claim 1 wherein the third and fourth transistors are PMOS transistors.

4. A circuit apparatus in accordance with claim 1 wherein the fifth transistor is an NMOS transistor.

5. A regulated cascode current source comprising:

an op amp;

a plurality of cascaded gain stages coupled to the op amp, wherein each cascaded gain stage comprises:

a current source circuit; and a level shifter circuit coupled to the current source circuit wherein the level shifter circuit has a circuit for independently controlling a voltage on a cascode node;

wherein the current source comprises:

a first transistor having a first, second and third terminal, a second terminal of the first transistor coupled to the level shifter current, and a third terminal coupled to the cascode node; and a second transistor having a first, second and third terminal, a first terminal of the second transistor coupled to the cascode node, a second terminal of the second transistor coupled to a voltage source, and a third terminal of the second transistor coupled to ground wherein the level shifter circuit comprises:

a third transistor having a first, second and third terminals the first terminal of the third transistor coupled to a voltage supply, and the third terminal of the third transistor coupled to the current source circuit;

a fourth transistor having a first, second and third terminal, the first terminal of the fourth transistor coupled to the voltage supply, the second terminal of the fourth transistor coupled to the second terminal of the third transistor, and the third terminal of the fourth transistor coupled to a circuit for independently controlling a voltage on a cascode node;

a fifth transistor having a first, second and third terminal, the first terminal of the fifth transistor coupled to the third terminal of the third transistor, the second terminal of the fifth transistor coupled to the circuit for independently controlling the voltage on a cascode node, and the third terminal of the fifth transistor coupled to ground;

the circuit for independently controlling the voltage on a cascode node, the circuit for independently controlling the voltage on a cascode node comprises:

a resistive element for independently controlling the voltage on a cascode node; and a capacitive element coupled in parallel to the resistive element, the resistive element and the capacitive element coupled to the second terminal of the fifth transistor and the cascode node.

6. A circuit apparatus in accordance with claim 5 wherein the first transistor and the second transistor are NMOS transistors.

7. A circuit apparatus in accordance with claim 5 wherein the third and fourth transistors are PMOS transistors.

8. A circuit apparatus in accordance with claim 5 wherein the fifth transistor is an NMOS transistor.

* * * * *